(12) United States Patent
    Jiang et al.

(10) Patent No.: US 12,621,942 B2
(45) Date of Patent: May 5, 2026

(54) LED DISPLAY MODULE AND LED DISPLAY PANEL

(71) Applicant: UNILUMIN GROUP CO., LTD., Shenzhen (CN)

(72) Inventors: Xiaosheng Jiang, Shenzhen (CN); Song Lei, Shenzhen (CN); Jinfeng He, Shenzhen (CN)

(73) Assignee: UNILUMIN GROUP CO., LTD., Shenzhen (CN)

( * ) Notice: Subject to any disclaimer, the term of this patent is extended or adjusted under 35 U.S.C. 154(b) by 85 days.

(21) Appl. No.: 18/633,083

(22) Filed: Apr. 11, 2024

(65) Prior Publication Data

US 2024/0260214 A1 Aug. 1, 2024

Related U.S. Application Data

(63) Continuation-in-part of application No. PCT/CN2022/107795, filed on Jul. 26, 2022.

(30) Foreign Application Priority Data

Dec. 24, 2021 (CN) .......................... 202123290567.1

(51) Int. Cl.
    *H05K 5/02* (2006.01)
(52) U.S. Cl.
    CPC ................................... *H05K 5/0217* (2013.01)
(58) Field of Classification Search
    CPC .. H05K 5/0217; F21V 33/0044; F21V 15/015
    USPC .................................. 362/368, 362, 365, 125
    See application file for complete search history.

(56) References Cited

U.S. PATENT DOCUMENTS

| | | | | |
|---|---|---|---|---|
| 2015/0070879 | A1* | 3/2015 | Bilinski | A47F 11/10 |
| | | | | 362/125 |
| 2020/0372842 | A1 | 11/2020 | Guan et al. | |
| 2021/0071417 | A1* | 3/2021 | Deleu | E04B 2/76 |
| 2022/0408577 | A1* | 12/2022 | Zhang | H05K 5/0247 |
| 2024/0013989 | A1* | 1/2024 | Zhou | G02B 6/006 |

FOREIGN PATENT DOCUMENTS

| | | |
|---|---|---|
| CN | 202058384 U | 11/2011 |
| CN | 104251416 A | 12/2014 |
| CN | 204423826 U | 6/2015 |
| CN | 207489372 U | 6/2018 |
| CN | 110675762 A | 1/2020 |

(Continued)

OTHER PUBLICATIONS

International Search Report for International Application No. PCT/CN2022/107795; Mailing Date, Oct. 9, 2022.

(Continued)

*Primary Examiner* — Edwyn Labaze
(74) *Attorney, Agent, or Firm* — CANTOR COLBURN LLP

(57) ABSTRACT

An LED display module and an LED display panel. The LED display module includes: an LED board, a bottom shell and a connecting member; the connecting member is made of magnetic attraction material, and includes a snap-fitting part and a connecting part, the connecting part is configured to be fixedly connected with the LED board, the snap-fitting part is configured to be connected with the bottom shell in a snap-fit manner.

10 Claims, 3 Drawing Sheets

(56)            References Cited

FOREIGN PATENT DOCUMENTS

| CN | 209895709 U | | 1/2020 | |
|----|-------------|---|--------|---|
| CN | 211016336 U | | 7/2020 | |
| CN | 212084562 U | | 12/2020 | |
| CN | 213716389 U | * | 7/2021 | ........... H05K 5/0247 |
| CN | 217008546 U | | 7/2022 | |
| WO | WO-2015161761 A1 | * | 10/2015 | ............. A47B 81/06 |

OTHER PUBLICATIONS

Written Opinion for International Application No. PCT/CN2022/107795; Mailing Date, Oct. 9, 2022.
Extended European Search Report for EP Application No. 22909268.9; Issue date, Oct. 30, 2025, 9 pages.

* cited by examiner

LED DISPLAY MODULE AND LED DISPLAY PANEL

CROSS-REFERENCE TO RELATED APPLICATIONS

This application is a continuation-in-part of PCT patent application Serial No. PCT/CN2022/107795, filed on Jul. 26, 2022, which claims priority to Chinese patent application No. 202123290567.1, filed with CNIPA on Dec. 24, 2021, and entitled "LED display module and LED display panel", the entire contents each of which are incorporated herein by reference.

TECHNICAL FIELD

The present application relates to the field of displaying technologies, and more particularly, to an LED display module and an LED display panel.

BACKGROUND

LED (Light Emitting Diode) display screen may display various patterns and video information, and has the advantages of high reliability, long service life, high cost performance, low use cost, strong environmental adaptability, and the like. With the rapid development of the industry of the LED display panel, people have higher and higher requirements on the LED display panel, such as ultra-light and ultra-thin requirements of an LED cabinet. The LED display module is an important component of the LED display panel, thus, people further requires that the LED display module is ultra-light and ultra-thin.

The LED display panel generally includes an LED display module and an LED cabinet, the LED display module is fixedly mounted in the LED cabinet, and the LED cabinet is fixedly mounted on the wall body. The LED display module includes an LED module, an LED board and a bottom shell. The LED module and the LED board are fixedly mounted in the bottom shell, and the bottom shell is fixedly connected with the LED cabinet. It is difficult to disassemble and assemble the LED display panel having this structure, and it is inconvenient to maintain the LED display panel.

In order to overcome the above problem, an LED display panel in which the LED display module and the LED cabinet are assembled in a magnetic attraction manner is provided, the LED board and the bottom shell are fixedly connected in a screw locking manner, and a plurality of iron sheets are arranged in the bottom shell. Moreover, a plurality of magnets are arranged at corresponding positions of the LED cabinet, the LED display module and the LED cabinet are assembled through a magnetic attraction force between the magnets and the iron sheets. However, the LED display panel having this structure needs to be provided with more iron sheets, and thus the weight of the LED display panel may be increased, and a user's requirement for an ultra-light LED display panel may not be effectively met.

SUMMARY

According to the various embodiments of the present application, an LED display module and an LED display panel are provided.

An LED display module, including: an LED board, a bottom shell and a connecting member; the connecting member is made of a magnetic attractive material, and includes a snap-fitting part and a connecting member, the snap-fitting part is connected with the connecting member, the connecting member is configured to be fixedly connected with the LED board, the snap-fitting part is configured to be connected with the bottom shell in a snap-fit manner.

An LED display panel, including an LED cabinet and the aforesaid LED display module; a magnet is arranged at a position of the LED cabinet corresponding to the connecting member.

The details of one or multiple embodiment(s) of the present application are set forth in the drawings and the description of the drawings below. Other features, objects, and benefits of the present application will become apparent from the description, the drawings and the claims.

DESCRIPTION OF THE DRAWINGS

In order to describe the technical solutions in the embodiments of the present disclosure or in the existing technologies more clearly, a brief introduction regarding the accompanying drawings that need to be used for describing the embodiments or the existing technologies is given below. It should be understood that, the following accompanying drawings are only some embodiments of the present disclosure. For the person of ordinary skill in the art, other drawings may also be obtained according to these drawings without paying creative effort.

DETAILED DESCRIPTION OF EMBODIMENTS

In order to make the objective, the technical solutions and the advantages of the present application be clearer and more understandable, the present application will be further described in detail below with reference to accompanying figures and embodiments. It should be understood that the embodiments described in detail herein are merely intended to illustrate the present application, rather than limiting the present application.

Figure 1:
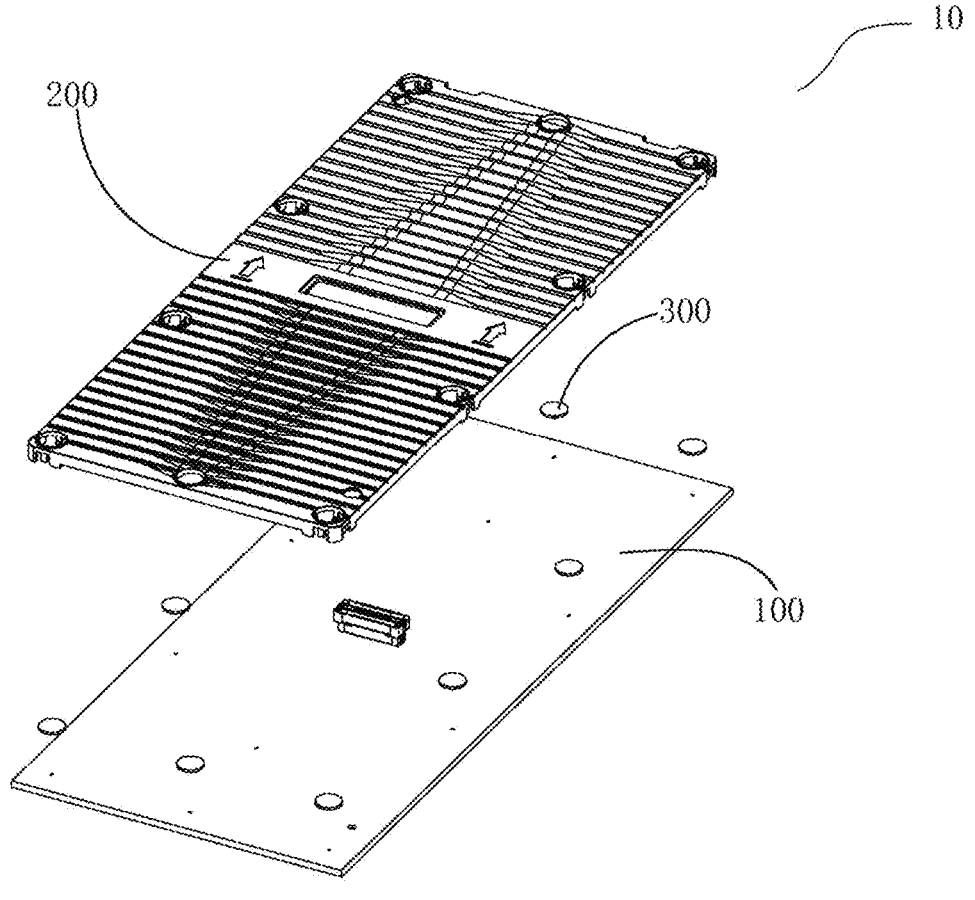
FIG. 1 illustrates schematic diagram of a three-dimensional structure of an LED display module in accordance with one embodiment of the present application.
Figure 2:
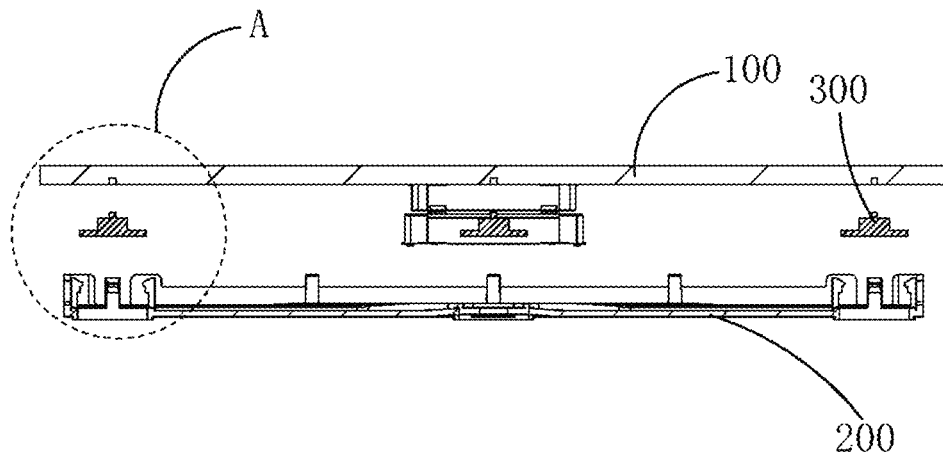
FIG. 2 illustrates a schematic diagram of a cross-sectional structure of an LED display module as shown in FIG. 1.
Figure 3:
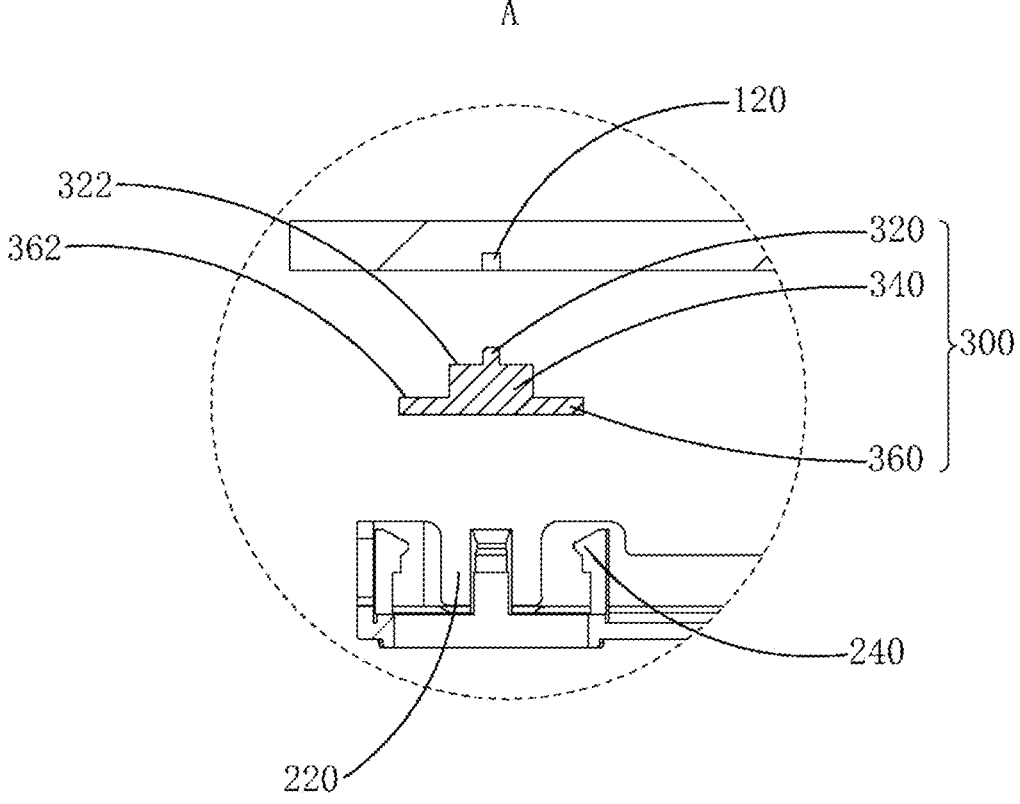
FIG. 3 illustrates an enlarged partial diagram of a part A shown in FIG. 2.

In one exemplified implementation mode, as shown in FIG. 1 and FIG. 2, an LED display module 10 is provided. The LED display module 10 includes an LED board 100 in which a plurality of LEDs are provided, a bottom shell 200 and a connecting member 300. The connecting member 300 is made of a magnetic attraction material, one end of the connecting member 300 is fixedly connected with the LED board 100, and the other end of the connecting member 300 is connected with the bottom shell 200 in a snap-fit manner. There may be two or more than two connecting members 300, and the number of the connecting members 300 may be set according to the actual requirement. The connecting member 300 may be made of iron or other magnetic attraction materials. In this embodiment, the connecting member 300 is made of iron. Furthermore, as shown in FIG. 3, the connecting member 300 includes a connecting part 340 and a snap-fitting part 360, the snap-fitting part 360 is connected with the connecting part 340, the connecting part 340 is configured to be fixedly connected with the LED board 100, and the snap-fitting part 360 is configured to be connected with the bottom shell 200 in a snap-fit manner. Various methods for fixing the connecting part 340 with the LED board 100 are included, the methods may include welding, bonding. In this embodiment, the connecting part 340 is welded with the LED board 100.

In one exemplified implementation mode, the connecting member 300 further includes a first positioning part 320 connected to one end of the connecting part 340 away from the snap-fitting part 360; and the LED board 100 is provided with a second positioning part 120 matching with the first positioning part 320. The first positioning part 320 matches with the second positioning part 120, in order to realize positioning and mounting of the connecting member 300 and the LED board 100. In this embodiment, the connecting member 300 includes the first positioning part 320, the connecting part 340 and the snap-fitting part 360 connected in sequence. Various methods for manufacturing the connecting member 300 are included. The connecting member 300 may be integrally formed, or be formed by manufacturing relevant parts and welding the relevant parts respectively. In this embodiment, the connecting member 300 is integrally formed.

Furthermore, the first positioning part 320 and the second positioning part 120 may have other structure, for example, the first positioning part 320 may be a positioning column or a positioning hole, and the second positioning part 120 should be a positioning hole or a positioning column accordingly. In this embodiment, the first positioning part 320 is a positioning column; and the second positioning part 120 is a positioning hole.

In one exemplified implementation mode, the connecting part 340 is in a cylindrical shape, and is fixedly connected to the LED board 100 in a welded connection manner, to realize a fixed connection between the connecting member 300 and the LED board 100. An end surface of the first positioning part 320 of the connecting part 340 is provided with a cut texture 322 configured to increase a welding area, thereby effectively improving a welding effect.

Furthermore, in one exemplified implementation mode, the snap-fitting part 360 is shaped as a disc, the snap-fitting part 360 and the connecting part 340 are coaxially arranged. In particular, an outer diameter of the snap-fitting part 360 is greater than an outer diameter of the connecting part 340, thus, a step 362 is formed on an end surface of the snap-fitting part 360 facing the connecting part 340, an accommodation part 220 is arranged at a position of the bottom shell 300 corresponding to the connecting member 300, and a clamping hook 240 is arranged in the accommodation part 220. When the snap-fitting part 360 is mounted in the accommodation part 220, the clamping hook 240 is clamped on the step 362, such that the connecting member 300 is detachably connected with the bottom shell 200. Additionally, the accommodation part 220 may have other structure. In this embodiment, the accommodation part 220 is a through hole, and the clamping hook 240 is arranged to extend outwards from an inner wall of the accommodation part 220.

It should be noted that the connecting member 300 and LED board 100 may also be fixedly connected by some other methods. Similarly, the snap-fit connection between the connecting member 300 and the bottom shell 200 may also be realized according to other snap-fit connection structure. The above descriptions of the snap-fitting part 360, the accommodation part 220, and the clamping hook 240 are only for the purpose of clearly describing the technical solutions of the present application, rather than limiting the present application.

Figure 4:
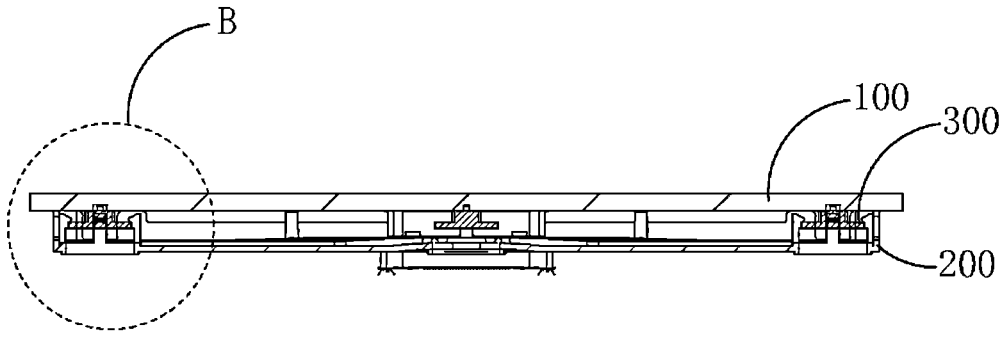
FIG. 4 illustrates a schematic diagram of a cross-sectional structure of an LED display module in accordance with one embodiment of the present application.
Figure 5:
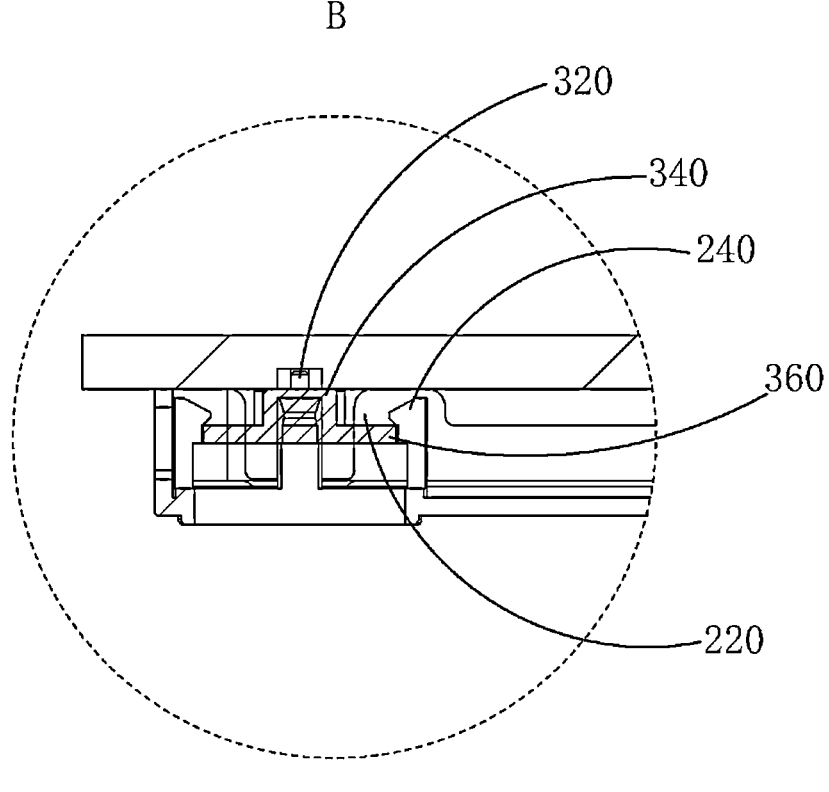
FIG. 5 illustrates a schematic enlarged partial view of a part B shown in FIG. 4.

In one exemplified implementation mode, an LED display panel is further provided. The LED display panel includes the aforesaid LED display module 10 and an LED cabinet configured to support the LED display module 10, and a magnet is arranged at the position of the LED cabinet corresponding to the connecting member 300 to achieve detachable connection between the LED display module 10 and the LED cabinet. As shown in FIG. 3 and FIG. 4, the LED display module 10 includes an LED board 100, a bottom shell 200 and a connecting member 300. The connecting member 300 is integrally formed by iron and includes a first positioning part 320, a connecting part 340 and a snap-fitting part 360 which are connected in sequence. The first positioning part 320 is configured to match with the second positioning part 120 on the LED board 100, in order to implement positioning and mounting of the connecting member 300 and the LED board 100. The first positioning part 320 may be a positioning column or a positioning hole, then, the second positioning part 120 is a positioning hole or a positioning column accordingly. The connecting part 340 is in a cylindrical shape, the snap-fitting part 360 is in a disc shape, the snap-fitting part 360 and the connecting part 340 are coaxially arranged, and an outer diameter of the snap-fitting part 360 is greater than an outer diameter of the connecting part 340, thus, a step 362 is formed at an end surface of the snap-fitting part 360 facing the connecting part 340. The bottom shell 200 is provided with an accommodation part 220 corresponding to the connecting member 300, and a clamping hook 240 is arranged in the accommodation part 220.

It should be noted that the LED display panel and the LED display module 10 are based on the same concept, regarding the detail of the specific implementation of the LED display module 10, reference can be made to the embodiment of the LED display module 10, and the technical features in the embodiment of the LED display module 10 are correspondingly applicable in the embodiment of the LED display panel, the LED display panel and the LED display module 10 also have the same technical effects. The details of the LED display panel are not repeatedly described herein.

In the LED display module 10 and the LED display panel provided in the present application, a detachable connection between the LED board 100 and the bottom shell 200 is realized by replacing the conventional screws with the connecting member 300 made of magnetic attraction material. Moreover, the connecting member 300 is directly used as a magnetic attraction member matched with the magnet on the LED cabinet of the LED display panel, the detachable connection between the LED display module 10 and the LED cabinet is realized without the need of arranging a magnetic attraction member additionally, the weight of the LED display panel is effectively reduced, and the requirement of the user for an ultra-light LED display panel is met. In addition, according to the technical solutions of this embodiment, a process of disassembly and assembly of the LED display module 10 and the LED display panel is effectively optimized, and an efficiency of disassembly and assembly of the LED display module 10 and the LED display panel is improved.

The various technical features in the aforesaid embodiments may be combined arbitrarily, for the convenience of description, not all possible combinations of the various technical features in the aforesaid embodiments are described. However, the combinations of these technical features should all be considered as falling within the protection scope of the description, as long as they are not contradicted with each other.

Several implementation methods of the present application are described in the aforesaid embodiments, and these implementation methods are described specifically and in detail; however, the implementation methods should not be interpreted as limitations to the protection scope of the present application. It should be noted that, a person of ordinary skill in the art may also make some modifications and improvements without departing from the concept of the present application, these modifications and improvements are all included in the protection scope of the present application. Thus, the protection scope of the present application should be determined by the attached claims.

What is claimed is:

1. A LED display module, comprising an LED board in which a plurality of LEDs are arranged, a bottom shell and one or a plurality of connecting member(s);

wherein each connecting member is made of a magnetic attraction material and comprises a snap-fitting part and a connecting part, the snap-fitting part is connected with the connecting part, and the connecting part is configured to be fixedly connected with the LED board; the snap-fitting part is configured to be connected with the bottom shell in a snap-fit manner, and the connecting member further comprises a first positioning part connected to an end of the connecting part being away from the snap-fitting part, and the LED board is provided with a second positioning part matching with the first positioning part.

2. The LED display module according to claim 1, wherein the connecting member is made of iron.

3. The LED display module according to claim 1, wherein the connecting part is welded to the LED board.

4. The LED display module according to claim 1, wherein the first positioning part is a positioning column, and the second positioning part is a positioning hole.

5. The LED display module according to claim 1, wherein the first positioning part is a positioning hole, and the second positioning part is a positioning column.

6. The LED display module according to claim 1, wherein an end surface of the first positioning part of the connecting part is provided with a cut texture configured to increase a welding area.

7. The LED display module according to claim 1, wherein the connecting part is in a cylindrical shape, and the snap-fitting part is in a disc shape; the snap-fitting part and the connecting part are coaxially arranged.

8. The LED display module according to claim 7, wherein an outer diameter of the snap-fitting part is greater than an outer diameter of the connecting part, and a step is further formed on an end face of the snap-fitting part facing the connecting part; the bottom shell is provided with an accommodation part corresponding to the connecting member, and a clamping hook is arranged in the accommodation part; when the snap-fitting part is mounted in the accommodation part, the clamping hook is arranged to be clamped on the step.

9. The LED display module according to claim 8, wherein the accommodation part is a through hole, and the clamping hook is arranged to extend outwards from an inner wall of the accommodation part.

10. The LED display module according to claim 1, wherein the connecting member is integrally formed.

* * * * *